(12) United States Patent
Mouli

(10) Patent No.: US 7,619,266 B2
(45) Date of Patent: Nov. 17, 2009

(54) IMAGE SENSOR WITH IMPROVED SURFACE DEPLETION

(75) Inventor: Chandra Mouli, Boise, ID (US)

(73) Assignee: Aptina Imaging Corporation, Grand Cayman (KY)

( * ) Notice: Subject to any disclaimer, the term of this patent is extended or adjusted under 35 U.S.C. 154(b) by 0 days.

(21) Appl. No.: 11/327,374

(22) Filed: Jan. 9, 2006

(65) Prior Publication Data

US 2007/0158709 A1 Jul. 12, 2007

(51) Int. Cl.
*H01L 31/062* (2006.01)
*H01L 31/113* (2006.01)

(52) U.S. Cl. .............. 257/291; 257/292; 257/233; 257/239; 257/458; 257/E27.132; 257/E27.133

(58) Field of Classification Search ............ None
See application file for complete search history.

(56) References Cited

U.S. PATENT DOCUMENTS

| | | | |
|---|---|---|---|
| 6,023,081 A * | 2/2000 | Drowley et al. | 257/292 |
| 6,140,630 A | 10/2000 | Rhodes | |
| 6,204,524 B1 | 3/2001 | Rhodes | |
| 6,278,102 B1 * | 8/2001 | Hook et al. | 250/208.1 |
| 6,310,366 B1 | 10/2001 | Rhodes et al. | |
| 6,326,652 B1 | 12/2001 | Rhodes | |
| 6,333,205 B1 | 12/2001 | Rhodes | |
| 6,376,868 B1 | 4/2002 | Rhodes | |
| 6,570,222 B2 * | 5/2003 | Nozaki et al. | 257/347 |
| 6,847,051 B2 | 1/2005 | Hong | |
| 2002/0117690 A1 | 8/2002 | Rhodes | |
| 2003/0228736 A1 * | 12/2003 | Kimura | 438/286 |
| 2004/0229424 A1 * | 11/2004 | Fischer et al. | 438/232 |
| 2005/0274994 A1 | 12/2005 | Rhodes | |
| 2006/0054937 A1 * | 3/2006 | Lucovsky et al. | 257/213 |
| 2006/0084195 A1 * | 4/2006 | Lyu | 438/48 |

FOREIGN PATENT DOCUMENTS

JP 04 038872 2/1992
JP 04038872 A * 2/1992

OTHER PUBLICATIONS

International Preliminary Report on Patentability dated Jul. 15, 2008, issued in PCT Application No. PCT/US2007/000408.
Manchanda, L., et al., Si-Duped Aluminates for High Temperature Metal-Gate CMOS: Zr-Al-Si-O, A Novel Gate Dielectric for Low Power Applications, Bell Laboratores, Lucent Technologies, Murray Hill, N.J. 07974, (2000).
Park< Hong Bae, et al., Effects of Plasma Nitridation of $Al_2O_3$ Interlayer on Thermal Stability, Fixed Charge Density, and Interfacial Trap States of $HfO_2$ Gate Dielectric Films Grown by Atomic Layer Deposition, Journal of Applied Physics, vol. 94, No. 3, Aug. 1, 2003.

* cited by examiner

*Primary Examiner*—Sue Purvis
*Assistant Examiner*—Leslie Pilar Cruz
(74) *Attorney, Agent, or Firm*—Dickstein Shapiro LLP

(57) ABSTRACT

An image sensor device having a pixel cell with a pinned photodiode, which utilizes the fixed charge of an high K dielectric layer over the n-type region for the pinning effect without implanting a p-type layer over the n-type region, and methods of forming such a device.

24 Claims, 13 Drawing Sheets

IMAGE SENSOR WITH IMPROVED SURFACE DEPLETION

FIELD OF THE INVENTION

The invention relates to imager technology. In particular, the invention relates to imager devices with a pinned photodiode.

BACKGROUND OF THE INVENTION

CMOS imagers are known in the art. Exemplary CMOS imaging circuits, processing steps thereof, and detailed descriptions of the functions of various CMOS elements of an imaging circuit are described, for example, in U.S. Pat. Nos. 6,140,630, 6,376,868, 6,310,366, 6,326,652, 6,204,524, and 6,333,205, each assigned to Micron Technology, Inc. The disclosures of the forgoing patents are hereby incorporated by reference in their entirety.

A typical pixel of a CMOS image sensor cell, in a 4T (four transistor) layout, includes a photodiode as a photoconversion device, a transfer gate for transferring photoelectric charges generated in the charge accumulating region of the photodiode to a floating diffusion region (sensing node). The floating diffusion region is typically connected to a gate of a source follower transistor. The source follower transistor provides an output signal to a row select access transistor having gate for selectively gating the output signal to a column line of a pixel cell. A reset transistor resets the floating diffusion region using a supply voltage applied at a source/drain region to a specified charge level before each charge transfer from the charge accumulating region of the photodiode. The pixel is typically isolated from other like cells of an imager array by shallow trench isolation regions. A 3T (three transistor) pixel cell works similarly, but does away with the transfer transistor, instead directly transferring charge from the photodiode to the source follower transistor.

Pinned photodiodes are utilized in image sensor technology in both CCD and CMOS imagers. A pinned photodiode is termed "pinned" because the potential in the photodiode is held to a constant value when the photodiode is fully depleted. A pinned photodiode typically includes an n-type conductivity charge accumulating region bound on the top and bottom by p-type conductivity layers; the top being an implanted layer and the bottom one being the substrate upon which the image sensor pixel is formed. It is also possible to utilize an oppositely doped scheme where the charge accumulating region is p-type. A pinned photodiode reduces the impact from surface states (trapped sites; dangling bonds) in silicon. Besides lower pixel noise, the pinned photodiode offers reduced dark current, due to quenching of surface-interface traps and improved blue response, since it is easier to collect "blue electrons" generated near the silicon-silicon-dioxide interface with the pinned photodiode.

In p+/n−/p− pinned photodiodes, the top surface is typically highly doped with acceptors by implantation. Such implants tend to create a tail distribution and lateral spread, depending on the species of implant (typically boron, $BF_2$) energy, and dosage. This presents two issues: compensation of n− diode region, and therefore, reduced fill factor; and deeper p+/n junction, which leads to complex optimization issues for the photodiode and transfer gate region.

In all integrated circuit technology, of which image sensor devices are a part, there is a constant desire to scale down the sizes of devices and at the same time increase their density. As image sensors having pinned photodiodes are scaled down, the photodiode necessarily gets a smaller and it becomes harder to create the pinning effect in the photodiode as the charge accumulating n-type region of the photodiode nears the surface of the substrate. The n-region of the photodiodes are necessarily kept away from the substrate surface, which has trap sites that could interfere with the photodiode operation. To compensate for the smaller photodiode area the n-region is pushed further into the substrate, gaining size in depth where it was lost in width so that fill factor reduction is mitigated. However, such changes in photodiode shape can lead to cross-talk between pixels as the photodiodes expand below the isolation structures (e.g., shallow trench isolation—STI).

BRIEF SUMMARY OF THE INVENTION

The invention relates to pixel cells having a pinned photodiode without utilizing an upper doped layer (p or n) of the substrate to facilitate the pinning effect. In an exemplary embodiment of the invention, an high K dielectric layer can be provided over the substrate and n-type region of the photodiode in lieu of the upper p-type layer to create a conventional, in-substrate, pixel cell. In another exemplary embodiment of the invention, the photodiode can be elevated over the pixel circuitry and can comprise an n-type layer and an overlying high K dielectric layer. In either of these exemplary embodiments, an oxide (or other dielectric) can be provided between the n-type region of the photodiode and the high K dielectric layer.

These and other features of the invention will be better understood from the following detailed description, which is provided in connection with the accompanying drawings.

DETAILED DESCRIPTION OF THE INVENTION

Figure 1:
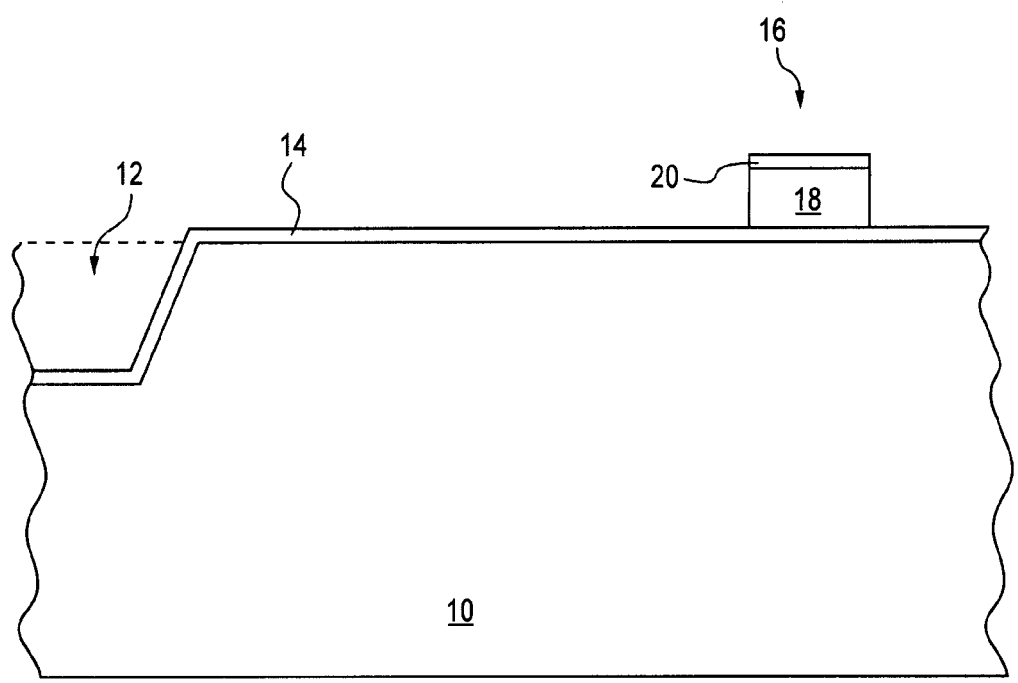
FIGS. 1-4 show a wafer cross-section at various processing steps for fabricating a pixel cell in accordance with the invention.

Although this invention will be described in terms of certain exemplary embodiments, other embodiments will be apparent to those of ordinary skill in the art, which also are within the scope of this invention. Accordingly, the scope of the invention is defined only by reference to the appended claims.

The term "substrate" in the following description refers to any supporting layer suitable for fabricating an integrated circuit, typically semiconductor based, but not necessarily so. A substrate may be silicon-based, may include epitaxial layers of silicon supported by a base semiconductor foundation, can be sapphire-based, silicon-on-insulator (SOI), metal, polymer, or any other materials suitable for supporting an integrated circuit or image sensor. When reference is made to a substrate or wafer in the following description, previous process steps may have been utilized to form regions or junctions in or over a base semiconductor or foundation.

The term "pixel" refers to a photo-element unit cell containing a charge accumulating photoconversion device and associated transistors for converting electromagnetic radiation to an electrical signal. The pixels discussed herein are illustrated and described as 4T (4 transistors) CMOS pixel circuits for the sake of example only. It should be understood that the invention is not limited to a four transistor (4T) pixel or CMOS technology, but may be used with other pixel arrangements having fewer (e.g., 3T) or more (e.g., 5T) than four transistors and other semiconductor imager technology, e.g., CCD and others. Although the invention is described herein with reference to the architecture and fabrication of one pixel, it should be understood that this is representative of a plurality of pixels as typically would be arranged in an imager array having pixels in rows and columns. The following detailed description is, therefore, not to be taken in a limiting sense, and the scope of the present invention is defined only by the appended claims.

The invention will now be explained with reference to the accompanying figures wherein like reference numbers are used consistently for like features throughout the drawings. FIGS. 1-5 show various stages of processing for a pixel cell 100, shown in FIG. 5 as a complete structure. The pixel cell 100 is formed without a doped layer in the substrate 10 at its surface, such as an upper p-type doped layer used in conventional CMOS pixels to form a pinned p+/n−/p− type photodiode (although, if the photodiode 102 is to be n/p/n in layout, the upper n-type doped layer would be omitted). However, the pixel cell 100 does have a pinned photodiode 102, and operates as a p+/n−/p− photodiode 102, since it utilizes a high K dielectric layer 42 with a fixed charge over the substrate 10 (instead of, for example, a doped p-type layer within the substrate 10), that functions like a capacitor plate having a fixed charge ($Q_f$). The high K dielectric layer 42 will have a fixed charge if the intrinsic dipole moments of the molecules of the material of the layer 42 are not completely randomly oriented in the material. The less random this orientation, the greater the fixed charge. This dipole moment orientation is a characteristic of the material and its stoichiometry. The specific orientation of the dipole moments will determine whether the fixed charge is positive or negative, for example, aluminum oxides tend to produce a negative charge and some nitrides tend to produce a positive charge. The materials for the high K dielectric layer 42 are selected based on this fixed charge property and the respective doping characteristics of the conductive regions of the associated photodiode 102 can be selected in accordance with the charge of the high K dielectric layer 42.

The high K dielectric layer 42, preferably contains a fixed negative charge, such as is produced by the aluminum oxides, and can create an hole accumulation region at the substrate 10 surface, while an n-type region 32 of the photodiode 102 acts as a charge accumulation region. This results in capacitive coupling in the photodiode active area. The negative charge of the high K dielectric layer 42 creates a positively charged, shallow minority carrier rich region at the substrate 10 surface above the n-type region 32, which functions like an extremely shallow, but highly concentrated and defined p-type layer.

Omitting the conventionally-used upper p-type layer from the photodiode 102 and, instead, utilizing the charge effect of the high K dielectric layer 42 allows photodiode 102 to have a shallower depth in the substrate 10 than would otherwise be available in pixel cell scaling. The n-type region 32 can be larger, for example, closer to the surface of the substrate 10 and as deep therein as allowable considering cross-talk behavior, for improved fill factor. Additionally, problems with the accidental or unintended implanting of p-type dopant into the n-type region associated with tail distribution of the implant profile are overcome since no p-type implant is performed above the n-type region. This also improves the resulting photodiode 102 fill factor because the n-type region is more consistently n-type and well controlled.

Figure 5:
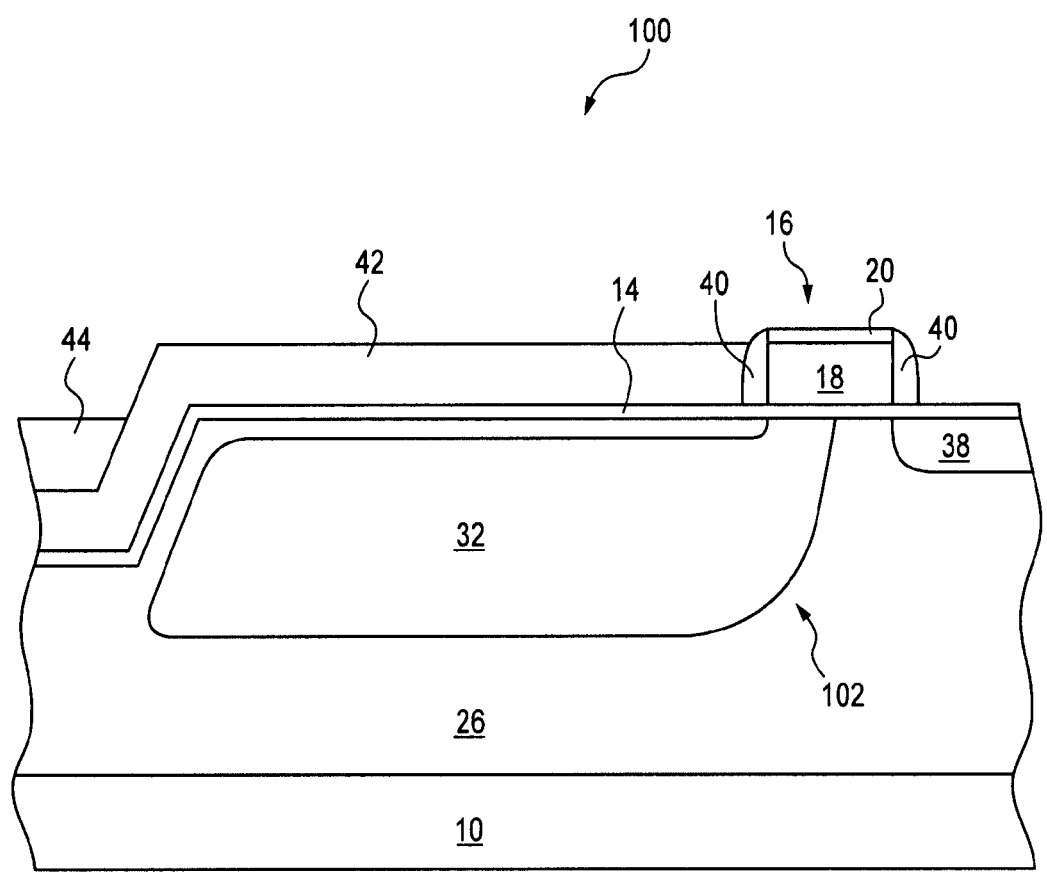
FIG. 5 shows a pixel cell, formed by the process illustrated by FIGS. 1-4, in accordance with the invention.
Figure 13:
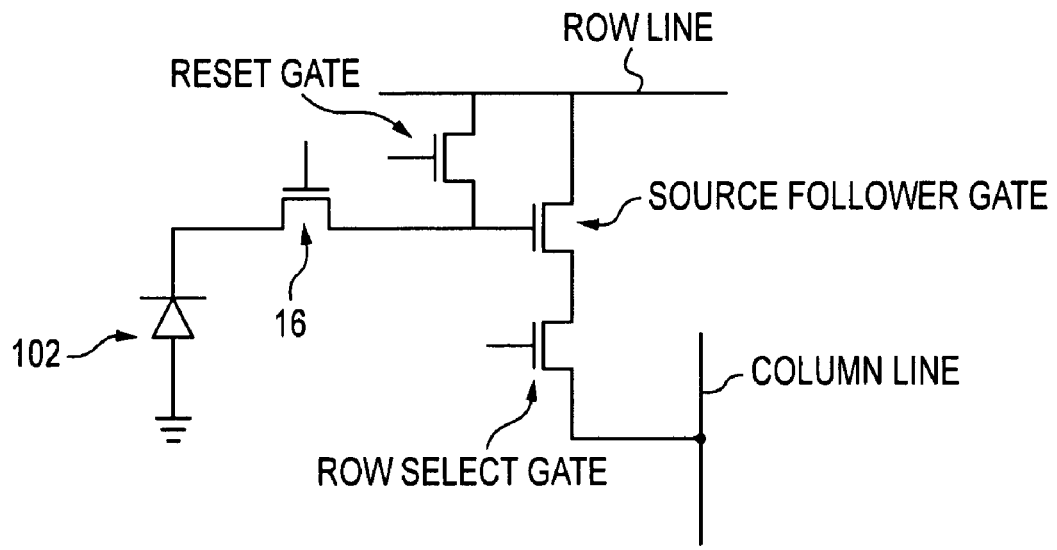
FIGS. 13 and 14 show circuit layouts for pixel cells in accordance with the invention.
Figure 14:
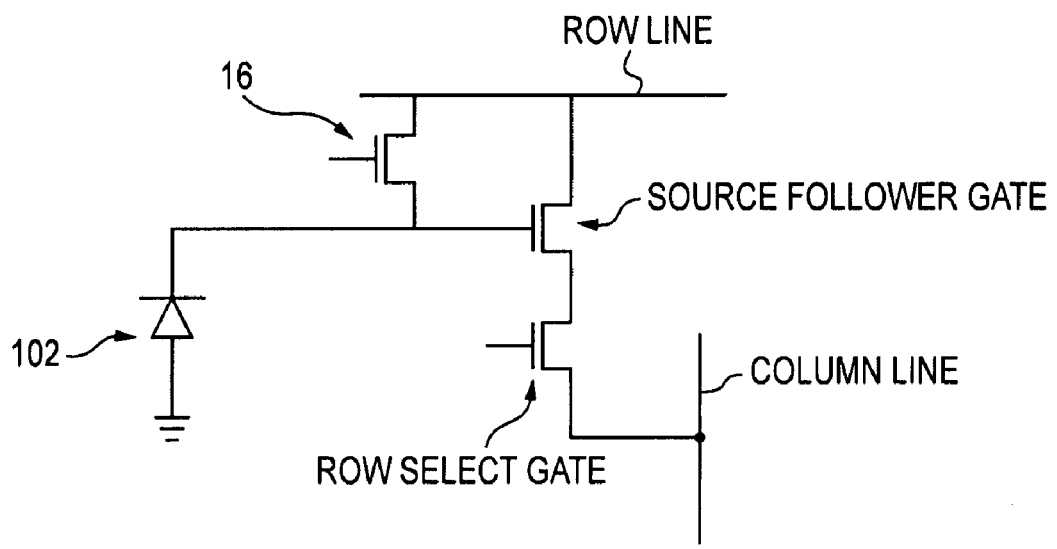

The pixel cell 100 of FIG. 5 is provided in a substrate 10. An epi layer p-well 26 can be provided in the substrate 10 to provide a concentrated p-type region in which to form the photodiode 102, if desired; however, since a silicon substrate or epi-layer is typically p-type without added doping, an implant may not be necessary. An n-type region 32 is provided within the substrate 10, within the p-well 26 if provided. A source/drain region 38 is provided within the substrate 10 also; it may be a floating diffusion region if the pixel cell 100 is a 4T (or more than four transistors) layout or an active area for connecting the photodiode 102 to reset circuitry (a reset voltage $V_{aa}$) if the pixel is a 3T (or fewer than three transistors) layout. A 4T pixel circuit in accordance with the invention is shown at FIG. 13, a 3T pixel circuit in accordance with the invention is shown in FIG. 14.

A transistor gate 16 is provided to gate charges between the photodiode 102 and source/drain region 38. If the pixel cell 100 has four or more transistors, the transistor gate 16 is typically a transfer gate, which gates charges accumulated at the photodiode 102 to a floating diffusion region (e.g., the source/drain region 38). If the pixel cell 100 has three transistors, the transistor gate 16 is typically a reset gate, in which case, region 38 is connected to a reset potential conductor (not shown). Regardless of its specific function, the transistor gate 16 comprises typical MOS transistor features, i.e., it has a gate electrode layer 18 over a gate oxide layer 14 and is insulated by sidewall spacers 40 and an insulating cap 20.

The pixel cell 100 is isolated from other like pixel cells of an image sensor array by shallow trench isolation (STI) regions 44. The gate oxide 14, which is part of the transistor gate 16 extends over the substrate 10 so as to at least cover the photodiode 102. Over the gate oxide 14 is provided the high K dielectric layer 42.

The high K dielectric layer 42 can be made of aluminum oxide having a stoichiometry of $Al_xO_y$, where x is typically about 2 and y is typically about 3. However, the stoichiometry can be tuned to achieve a desired fixed charge in the material, which changes based, in part, on stoichiometry. Other high K dielectric materials, i.e., materials with a dielectric constant greater than that of silicon oxide (meaning higher than about 3.9), can also be used for layer 42, such as zirconium oxide ($ZrO_x$), hafnium oxide ($HfO_x$), and hafnium silicates ($Hf_aSi_bO_c$), for example. The thickness of the high K dielectric layer 42 also plays a roll in determining the fixed charge and should be taken into consideration along with the stoichiometry when providing the layer 42. Using these parameters, an high K dielectric layer 42 of $Al_2O_3$ or $HfO_2$ of about 60 Å (6 nm) thickness can have a fixed charge of about $2\times10^{12}$ cm$^{-2}$ to about $10\times10^{12}$ cm$^{-2}$.

The pixel cell 100 operates as a standard CMOS imager pixel. The photodiode 102 generates charge at the effective p-n junction created by the induced capacitance interaction between the high K dielectric layer 42 and the n-type region 32 when the photodiode 102 is struck by light. The charge generated and accumulated at the photodiode 102 is gated, for example by transistor gate 16, to the floating diffusion region, e.g., source/drain region 38 if the pixel cell 100 is 4T (FIG. 13) or more, or a floating diffusion region formed as an extension of the photodiode 102 n-type region 32 if the pixel cell 100 is 3T (FIG. 14). The charge at the floating diffusion region is converted to a pixel output voltage signal by a source follower transistor connected to floating diffusion region and this output signal is gated by row select transistor to read circuitry (not shown). After the signal is read out of the pixel cell 100, a reset gate (gate 16 in a 3T arrangement (FIG. 14), not shown with respect to other pixel arrangements) can be activated to connect a voltage source (e.g., $V_{aa}$) to the photodiode 102 to reset the pixel cell 100.

FIGS. 1-4 show cross sections of a pixel cell 100 as shown in FIG. 5 at various stages of fabrication. The figures generally show sequential steps, which may be utilized to form a pixel cell 100; however, other or additional processing steps may be used also. Now referring to FIG. 1, a substrate 10 is provided. The substrate 10 is typically silicon, though other semiconductor or other materials as discussed above as suitable for use as substrates can be used. The substrate 10, if desired, can be grown as an epi-layer over a supporting silicon base.

Shallow trench isolation (STI) is initiated to form trenches 12 of about 1,500 Å to about 4,000 Å deep, preferably about 2,000 Å deep, for what will become STI regions 44 (FIG. 5), which are typically an oxide material and serve to electrically isolate the pixel cell 100 from other pixel cells of an image sensor array. STI processing, including the etching of trenches 12, is well known in the art and standard processing techniques may be used. The portion of the substrate 10 under the STI trench 12 can be doped (not shown) to improve electrical isolation if desired.

Over the substrate, a transistor gate 16, which may be part of a transfer transistor in some embodiments of the pixel cell 100 or a reset transistor in other embodiments, is formed, typically simultaneously with the formation of the gates of other transistors of the pixel cell 100, e.g., a source follower transistor and row select transistor (not shown). This gate 16 (as well as others of the pixel cell 100) may be fabricated by forming a gate oxide 14 over the substrate 10, a conductive layer 18 over the gate oxide 14, and an insulating layer 20 over the conductive layer 18. These layers 14, 18, and 20 can be formed by known techniques, such as chemical vapor deposition or sputtering. The gate oxide 14 is typically silicon dioxide, but may be other materials as well, and is deposited over the substrate 10 in the area of the pixel cell 100, including into the STI trench 12. The gate oxide layer 14 can be from about 10 Å to about 80 Å thick, with about 50 Å being preferred. The conductive layer 18 is typically doped polysilicon, but may be other conductive materials as well. The insulating layer 20 is typically a nitride or TEOS (tetraethyl orthosilicate oxide), but may be other insulating materials as well. These layers 14, 18, and 20, are patterned with a photoresist mask and etched using the gate oxide 14 as a stop layer to leave a gate stack 16 as shown in FIG. 3.

Figure 2:
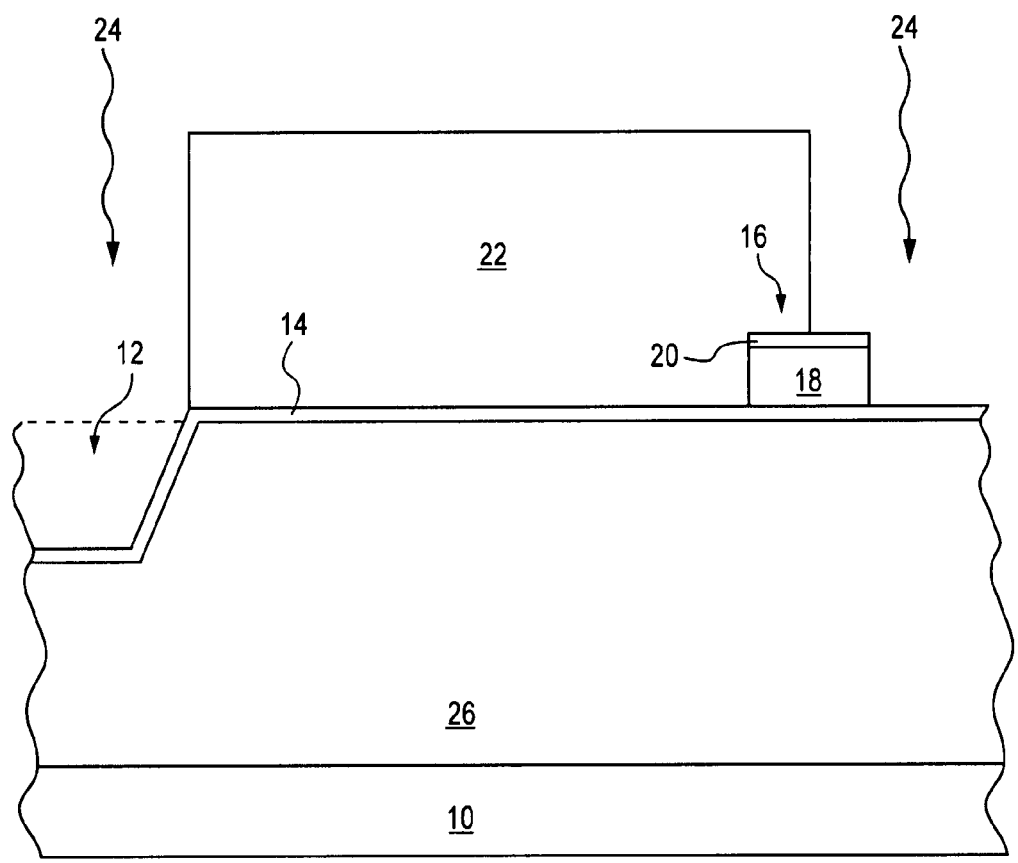
Figure 4:
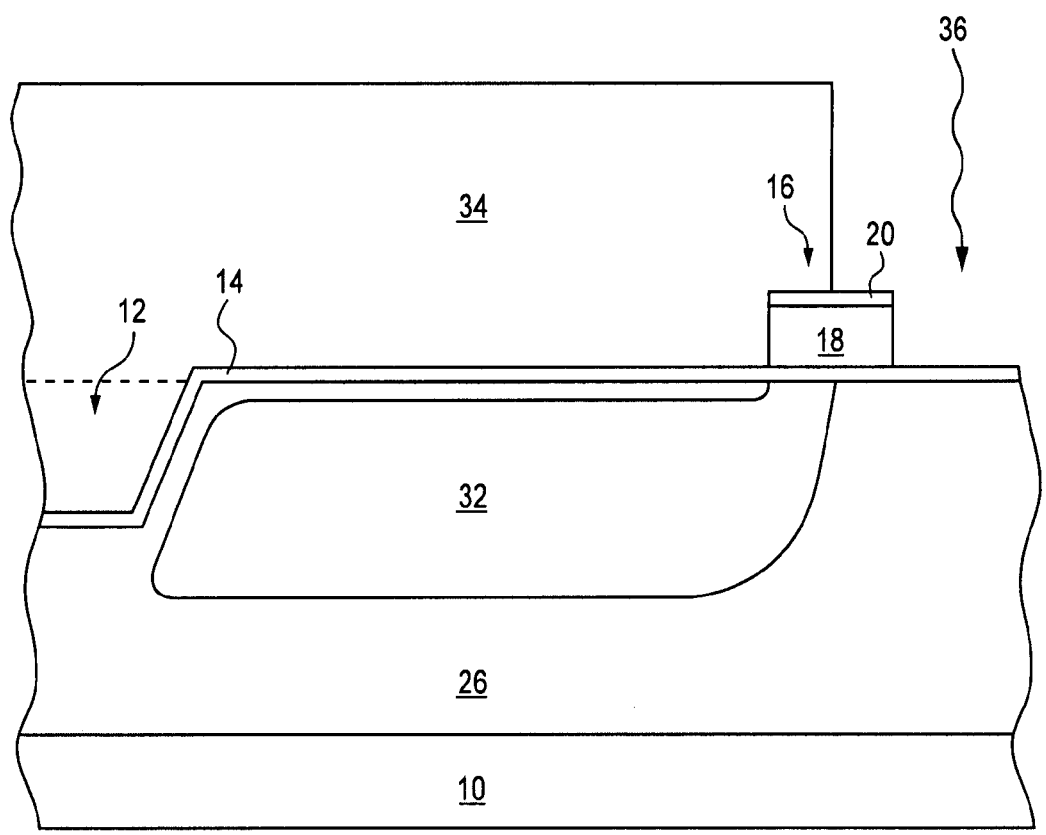

Now referring to FIG. 2, the wafer cross-section of FIG. 1 is shown at a subsequent stage of fabrication. A photoresist mask 22 is formed over the substrate 10 to protect the region that will become the photodiode 102 while exposing the substrate 10 surfaces proximate the transistor gates 16, and proximate to any other transistor gates of the pixel where source/drain regions of pixel transistors will be formed. A p-type dopant 24, e.g., boron, is implanted into the substrate 10 to form a p-well 26 therein. If desired, source/drain regions for the pixel cell 100 transistors can be formed at this stage of processing, but these regions are preferably formed in a subsequent stage of processing (FIG. 4). The photoresist mask 22 can then be removed.

Figure 3:
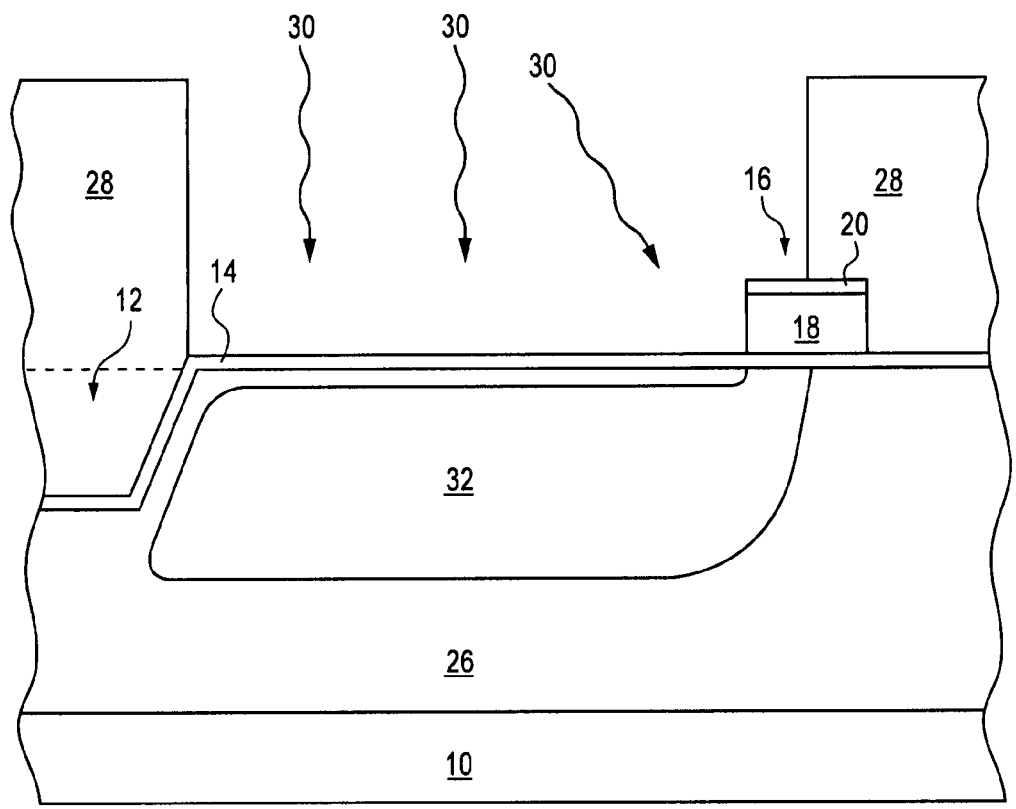

Now referring to FIG. 3, which shows the wafer at a subsequent stage of processing to that shown in FIG. 2. After forming the p-well 26 and removal of the photoresist mask 22, another photoresist mask 28 can be applied, which exposes the surface of the substrate 10 where the photodiode 102 will be formed. An n-type dopant 30, e.g., phosphorus, is implanted into the substrate 10 (directly there-into and at an angle thereto as shown) to form an n-type doped region 32. This n-type region 32 will form a charge accumulation portion of the photodiode 102. This n-type region is preferably about 8,000 Å deep from the surface of the substrate 10.

Now referring to FIG. 4, this figure shows the wafer cross-section shown in FIG. 3 at a subsequent stage of fabrication. After removing photoresist 28, another photoresist mask 34 can be formed to protect the photodiode 102 region of the substrate 10. An n-type dopant 36, e.g., phosphorus or arsenic, can be implanted into the substrate 10 to form active area 38 proximate the gate 16, as well as source/drain regions at any other transistors of the pixel cell 100. The dopant implant 36 may also be angled with respect to the substrate 10 so the doped regions extend under the gates, if desired. Dopant implantation can be accomplished by known techniques.

FIG. 5 shows the wafer cross-section of FIG. 4 at a subsequent stage of processing. After removal of the photoresist 34, an insulating layer 40 is deposited by known techniques over the gate oxide layer 14, and transistor gate 16. This insulating layer 40 is then etched to form protective sidewalls for the transistor gate 16, leaving the gate oxide 14 over the substrate 10. Then, a high K dielectric layer 42 is deposited over the substrate 10, patterned, and etched to leave the layer 42 over the photodiode 102 region of the substrate 10, as shown in FIG. 5. The high K dielectric layer 42 can be deposited by known techniques, such as CVD or sputtering. As discussed above, the high K dielectric layer 42 can be many different materials, but is preferably aluminum oxide $Al_xO_y$, zirconium oxide ($ZrO_x$), hafnium oxide ($HfO_x$), or hafnium silicates ($Hf_aSi_bO_c$). As discussed above, the high K dielectric layer 42 can be varied in material composition, stoichiometry, and thickness to obtain the desired fixed charge characteristics; however, the high K dielectric layer 42 is preferably between about 20 Å and about 200 Å thick. The high K dielectric layer 42 can be formed and left within the STI trench 12 (FIG. 4). The STI insulating material 44 is formed over the high K dielectric layer 42 within the trench 12. At this stage of fabrication, the pixel cell 100 is substantially complete. Subsequent processing can include the forming of protective insulating layers and conductive interconnects between the pixel cell 100 and other circuitry.

Figure 10:
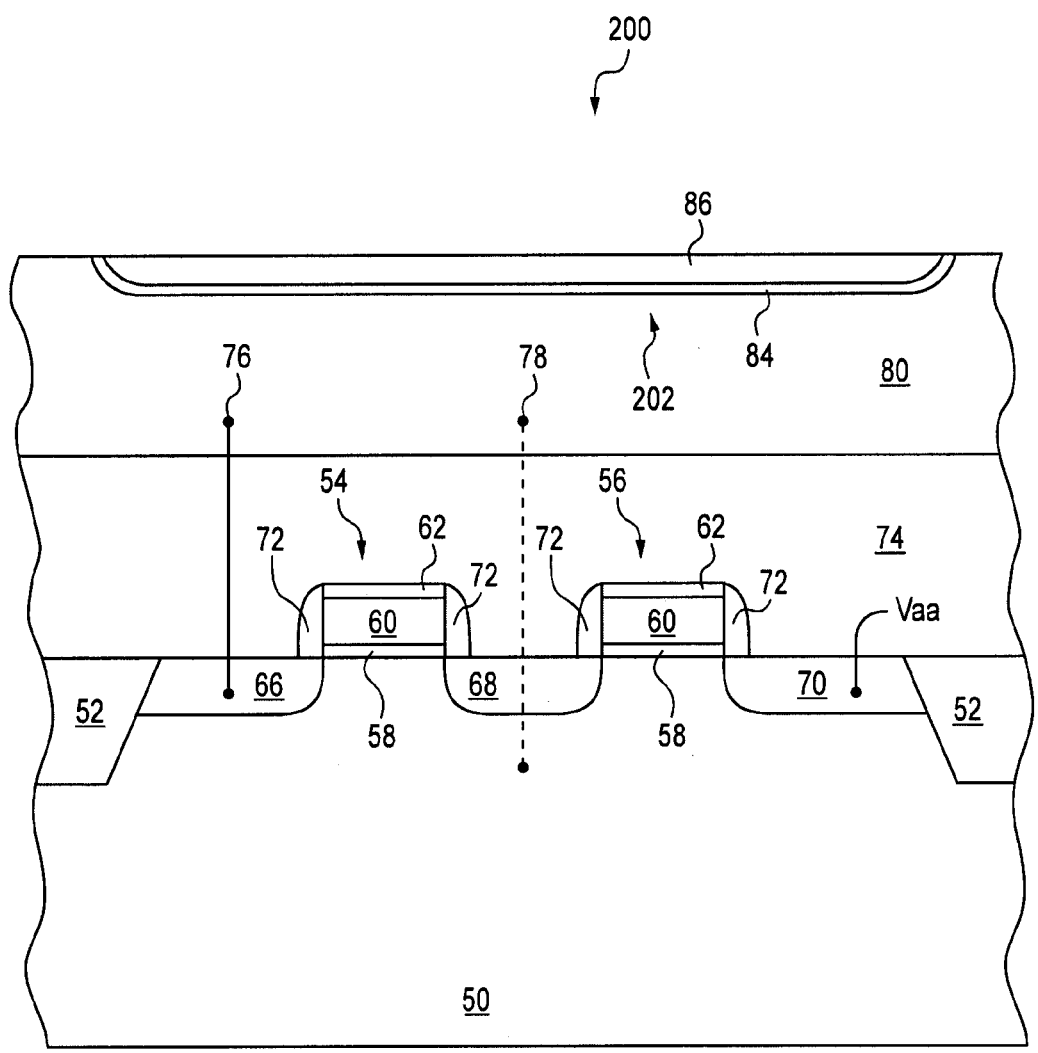
FIG. 10 shows a pixel cell, formed by the process illustrated by FIGS. 6-9, in accordance with the invention.

An alternative structure is shown in FIG. 10, which shows another exemplary embodiment of a pixel cell 200 in accordance with the invention. The pixel cell 200 of FIG. 10 includes an elevated photodiode 202, which is provided over the substrate 50 as opposed to substantially within it as in the embodiment shown in FIG. 5. Unlike a planar, non-elevated pixel, it is conventionally considered difficult to create a pinned photodiode in an elevated pixel. Elevated pixels, such as pixel cell 200 of FIG. 10, offer several advantages over planar pixels, including, higher Quantum efficiency and reduced optical cross-talk due to close proximity to the microlense. While the positioning of the photodiode 202 of FIG. 10 is elevated and, therefore, different from the planar configured photodiode 102 of FIG. 5, it has many similarities and is a pinned photodiode. Instead of a p-type layer over the n-type region 80, as found in conventional pixel cells, the photodiode 202 of pixel cell 200 utilizes a high K dielectric layer 86 over the n-type region 80. An oxide layer 84 separates a high K dielectric layer 86 over an n-type region 80 to create a virtual p+/n−/p− diode. This structure includes the advantages discussed above with respect to the pixel cell 100 shown in FIG. 5 due to the utilization of the high K dielectric layer 86 and omission of the p-type layer.

The pixel cell 200 of FIG. 10 is formed over a substrate 50. It is isolated from other like pixel cells of an image sensor array by STI regions 52 within the substrate 50 and by other isolation means, e.g., oxide regions (not shown), surrounding the elevated photodiode 202. Transistors are provided for operating the pixel cell 200; of these, a transfer transistor having gate 54 and a reset transistor having gate 56 are shown in FIG. 10. FIG. 10 shows a cross-section of an exemplary 4T pixel cell 200, but the invention is not limited to such. The transfer transistor gate 54 is associated with source/drain regions 66 and 68 and is connected with the overlying photodiode 202 at the n-type region (the charge accumulation region) by contact 76 to source/drain region 66.

The transfer transistor gate 54 is connected to the reset transistor gate 56 at source/drain region 68, which can be the floating diffusion region of the pixel cell 200 and electrically connects with a source follower transistor (not shown). The reset transistor gate 56 is also associated with source/drain region 70, which can be connected to a reset voltage $V_{aa}$ for resetting the photodiode 202.

Over the transistors and substrate 50 is provided an interlayer dielectric 74 to protect the transistors and separate the substrate 50 from the elevated photodiode 202. this interlayer dielectric 74 can be may different insulating materials as is know in the art, but is preferably BPSG or similar material. The interlayer dielectric 74 is preferably about 1,000 Å thick. An optional contact 78 can be provided from the photodiode 202 n-type region 80 to the substrate 50 as a strap to assist in pinning the photodiode by tying the charge of the substrate to the n-type region 80.

Figure 6:
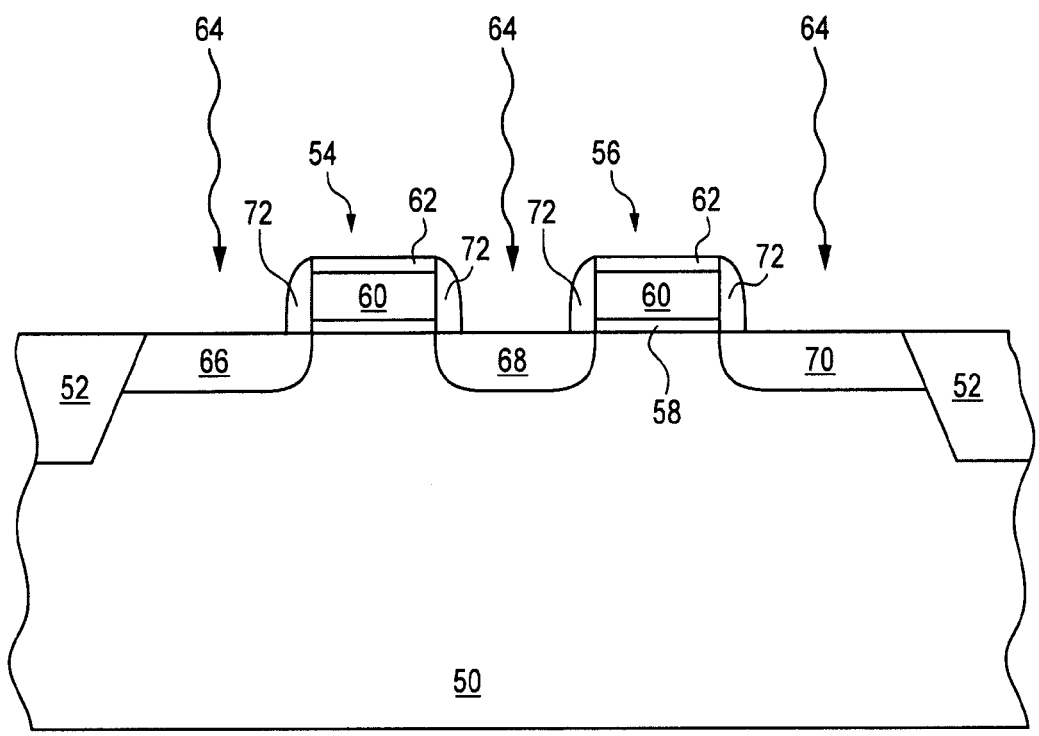
FIGS. 6-9 show a wafer cross-section at various processing steps for fabricating a pixel cell in accordance with the invention.

FIGS. 6-9 shown various stages of fabrication for the pixel cell 200 shown in FIG. 10. FIG. 6 shows the formation of the transfer and reset transistors having respective gates 54 and 56. A substrate 50, which may be similar to or the same as the substrate 10 of the structure shown in FIG. 5, is provided. STI regions 52 are formed around the pixel cell 200 (FIG. 10), as is known in the art. A gate oxide 58, typically silicon oxide, is formed over the substrate 50. A conductive layer 60, which is typically doped polysilicon, but may be other materials as well, is formed over the gate oxide layer 58. An insulating cap layer 62 is formed over the conductive layer 60. Implants 64 are provided to form source/drain regions 66, 68, and 70. Insulating sidewalls 72 are formed on the gates 54 and 56. The formation of gates 54 and 56 as well as the source/drain regions 66, 68, and 70 are well known processes and may be accomplished by known techniques.

Figure 7:
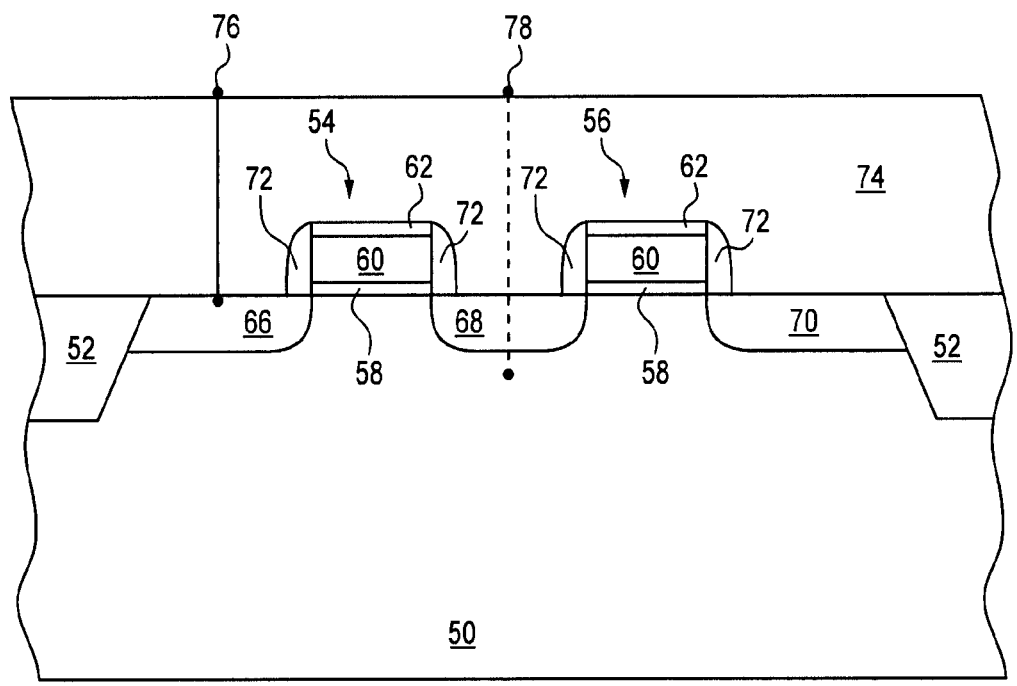

Now referring to FIG. 7, which shows the wafer cross-section of FIG. 6 at a subsequent stage of processing. FIG. 7 shows that an interlayer dielectric 74 is deposited over the substrate 50 and transistor gates 54 and 56. The interlayer dielectric 74 is preferably BPSG, but may be other insulating materials also; it is preferably about 1,000 Å thick and can be deposited by known techniques. The interlayer dielectric 74 can be planarized by CMP in preparation for subsequent fabrication steps. Contact 76, which will connect the photodiode 202 (FIG. 10) to the underlying circuitry, and optional contact 78, which can connect the photodiode 202 (FIG. 10) to the substrate, are formed through the interlayer dielectric 74 by known etching and deposition techniques. Contacts 76 and 78 can be many conductive materials, such as tungsten, nickel, titanium, doped poly, and other materials formed in vias in layer 74.

Figure 8:
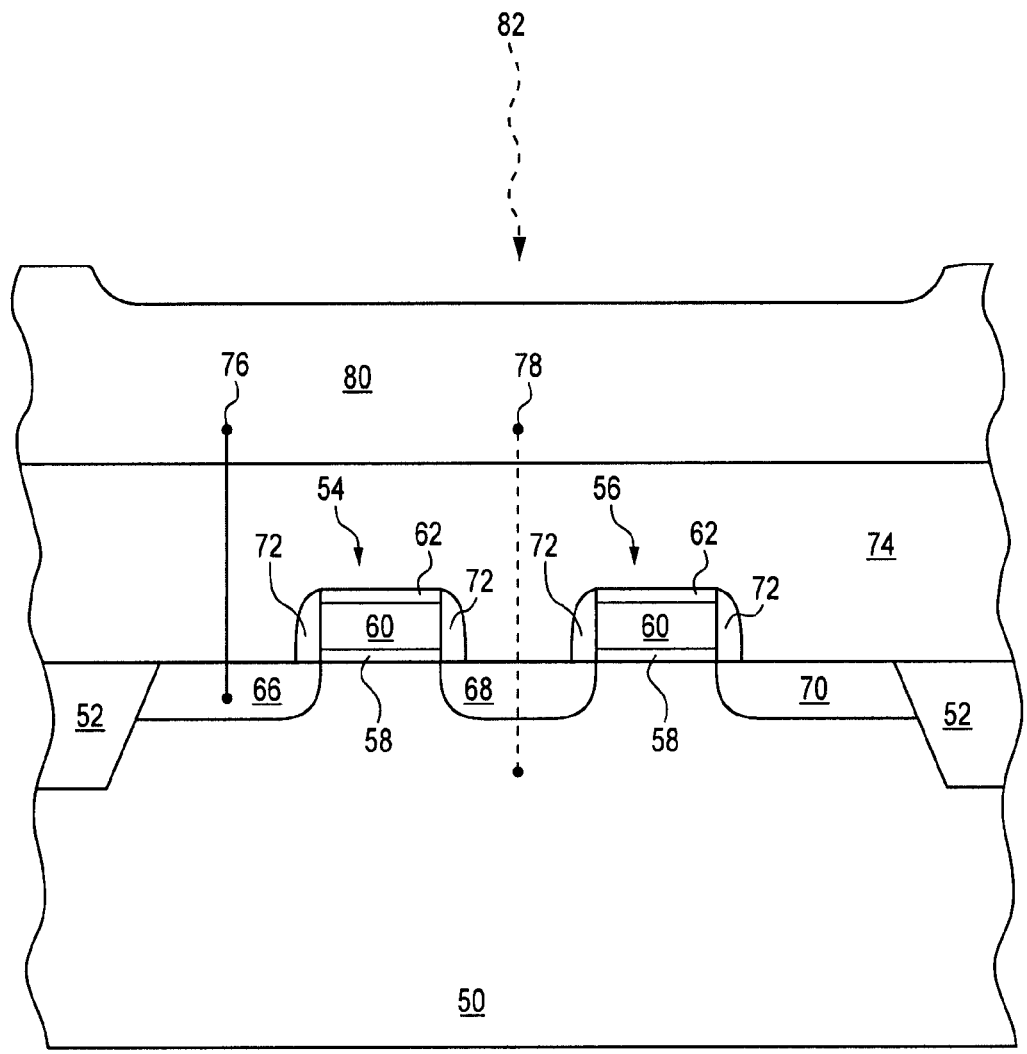

Now referring to FIG. 8, which shows the wafer cross-section of FIG. 7 at a subsequent stage of processing. FIG. 8 shows the deposition of a silicon layer over the interlayer dielectric 74 and contacts 76 and 78 that will provide the n-type region 80 for the photodiode 202 (FIG. 10). An n-type dopant 82 can be implanted to create the n-type region 80, or alternatively, the region 80 can be doped during deposition. Preferably, the n-type region 80 is etched to provide a shallow trench in which to form overlying layers; however this is optional.

Figure 9:
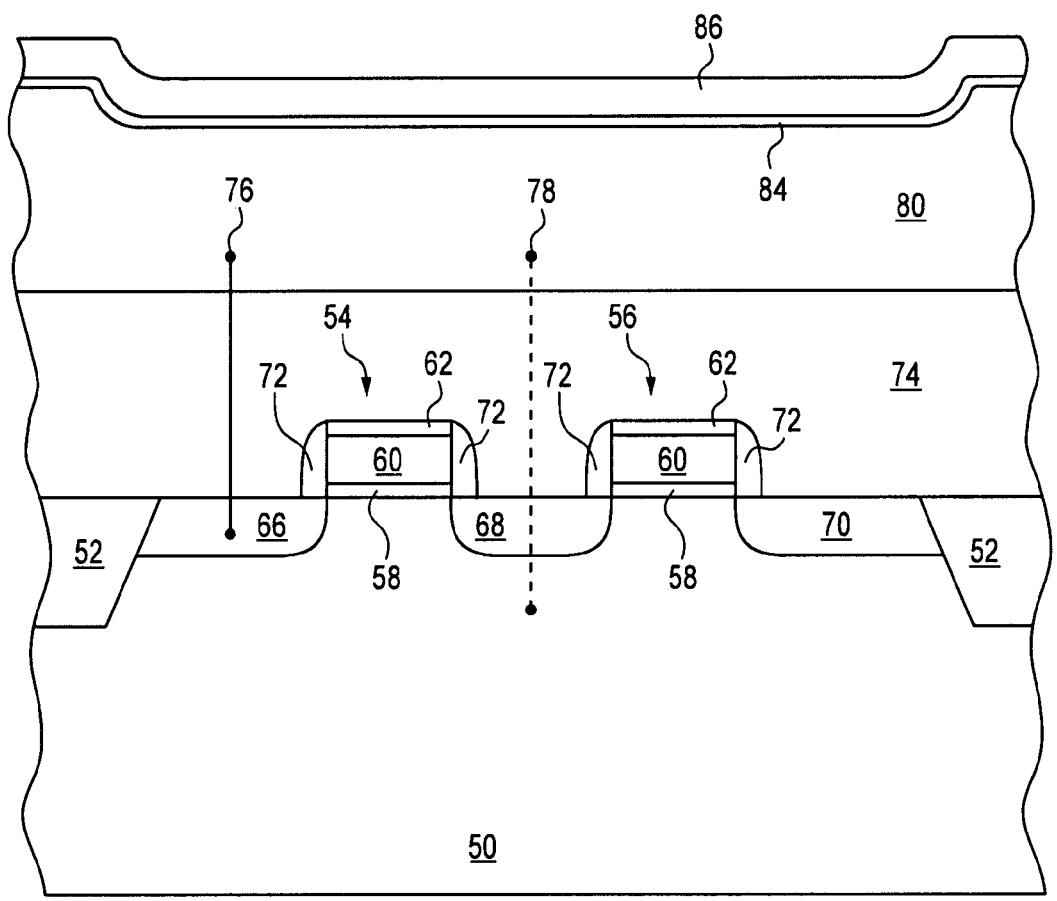

Now referring to FIG. 9, which shows the wafer cross-section of FIG. 8 at a subsequent stage of processing. FIG. 9 shows the formation of an oxide layer 84 over the n-type region 80. The oxide layer 84 can be silicon oxide and can be about 10 Å to about 80 Å thick, preferably about 50 Å. The oxide layer 84 can be deposited by known techniques. Over the oxide layer 84, an high K dielectric layer 86 is formed, which can be same materials as for layer 42 of the pixel cell 100 of FIG. 5. The high K dielectric layer can be about 20 Å to about 200 Å thick. Chemical mechanical polishing (CMP) can be used to planarize the wafer, using the n-type region 80 as a stop. This results in the structure shown in FIG. 10.

Figure 11:
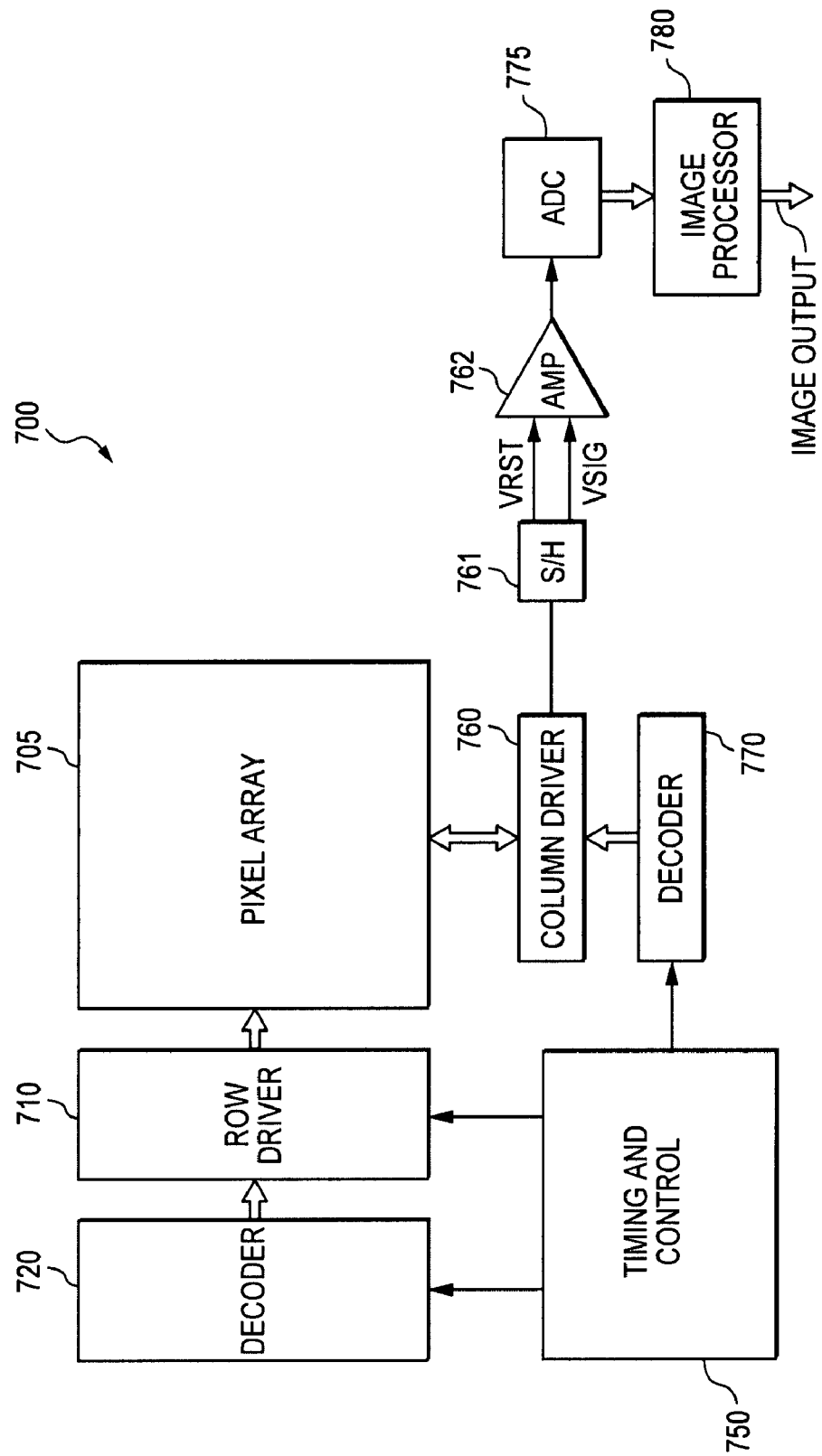
FIG. 11 shows an imager constructed in accordance with an embodiment of the invention.

FIG. 11 illustrates an exemplary imager 700 (i.e., image sensor) that may utilize any embodiment of the invention. The imager 700 has a pixel array 705 comprising pixel cells (e.g., 100 and 200) constructed as described above with respect to FIGS. 5 and 10 or using other pixel architectures. Row lines are selectively activated by a row driver 710 in response to row address decoder 720. A column driver 760 and column address decoder 770 are also included in the imager 700. The imager 700 is operated by the timing and control circuit 750, which controls the address decoders 720, 770. The control circuit 750 also controls the row and column driver circuitry 710, 760 in accordance with the invention.

A sample and hold circuit 761 associated with the column driver 760 reads a pixel reset signal $V_{rst}$ and a pixel image signal $V_{sig}$ for selected pixels. A differential signal ($V_{rst}-V_{sig}$) is amplified by differential amplifier 762 for each pixel and is digitized by analog-to-digital converter 775 (ADC). The analog-to-digital converter 775 supplies the digitized pixel signals to an image processor 780 which forms a digital image. The image processor 780 may also determine the gain setting of the imager 700, which can be used to set the level of the voltage applied to the pixels transfer transistor gates.

Figure 12:
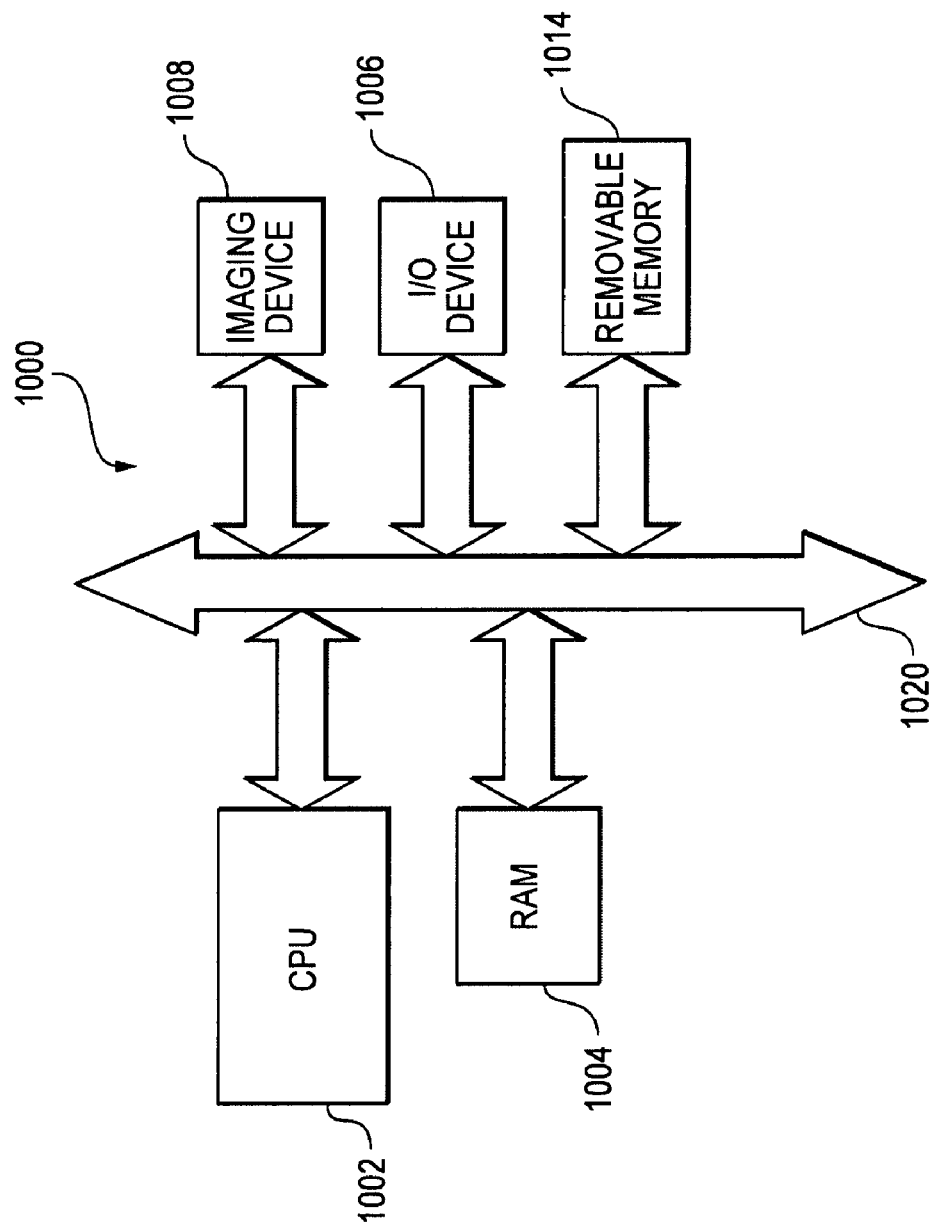
FIG. 12 shows a processor system incorporating at least one imager constructed in accordance with an embodiment of the invention.

FIG. 12 shows a processor system 1000, which is a typical processor system modified to include an imaging device 1008 (such as an imaging device with a pixel cell, e.g., 100 or 200, as illustrated in FIGS. 5 and 10) of the invention. The processor system 1000 is exemplary of a system having digital circuits that could include image sensor devices. Without being limiting, such a system could include a computer system, camera system, scanner, machine vision, vehicle navigation, video phone, surveillance system, auto focus system, star tracker system, motion detection system, image stabilization system, and data compression system, and other systems employing an imager.

System 1000, for example a camera system, generally comprises a central processing unit (CPU) 1002, such as a microprocessor, that communicates with an input/output (I/O) device 1006 over a bus 1020. Imaging device 1008 also communicates with the CPU 1002 over the bus 1020. The processor-based system 1000 also includes random access memory (RAM) 1004, and can include removable memory 1014, such as flash memory, which also communicate with the CPU 1002 over the bus 1020. The imaging device 1008 may be combined with a processor, such as a CPU, digital signal processor, or microprocessor, with or without memory storage on a single integrated circuit or on a different chip than the processor.

Various embodiments of the invention have been described above. Although this invention has been described with reference to these specific embodiments, the descriptions are intended to be illustrative of the invention and are not intended to be limiting. Various modifications and applications may occur to those skilled in the art without departing from the spirit and scope of the invention as defined in the appended claims.

What is claimed as new and desired to be protected by Letters Patent of the United States is:

1. A pixel cell comprising a photodiode, said photodiode comprising a charge accumulation region, an oxide layer over said charge accumulation region, a virtual p-type layer between the charge accumulation region and the oxide layer, a fixed charge layer over said oxide layer, and a shallow trench isolation region, wherein at least one of the oxide layer or fixed charge layer extends under the shallow trench isolation region.

2. The pixel cell of claim 1, wherein said fixed charge layer comprises an high K dielectric material.

3. The pixel cell of claim 1, wherein no p-type implant region is present between said charge accumulation region and said oxide layer.

4. The pixel cell of claim 1, wherein said charge accumulation region is provided within a substrate.

5. The pixel cell of claim 1, wherein said oxide layer is a gate oxide.

6. The pixel cell of claim 1, wherein said charge accumulation region, said oxide layer, and said fixed charge layer are provided over a substrate.

7. The pixel cell of claim 1, wherein the substrate between the charge accumulation region and the oxide layer is not counter-doped relative to the charge accumulation region.

8. The pixel cell of claim 1, wherein said fixed charge layer comprises aluminum oxide.

9. The pixel cell of claim 8, wherein said aluminum oxide has a stoichiometry of $Al_xO_y$, where x is about 2 and y is about 3.

10. The pixel cell of claim 1, wherein said fixed charge layer comprises a material selected from the group consisting of hafnium oxide, zirconium oxide, and hafnium silicates.

11. The pixel cell of claim 10, wherein said oxide layer is provided at least partially over said substrate.

12. A pixel cell, comprising:
a photodiode, said photodiode comprising:
a semiconductor substrate;
an n-type doped charge accumulation region within said substrate;
a silicon oxide layer over said substrate, wherein the substrate between the charge accumulation region and the silicon oxide layer is not counter-doped relative to the charge accumulation region;
an $Al_2O_3$ layer over said silicon oxide layer; and
a shallow trench isolation region, wherein at least one of the silicon oxide layer or $Al_2O_3$ layer extends under the shallow trench isolation region.

13. A pixel cell comprising a pinned photodiode, the photodiode comprising a charge accumulation region, an oxide layer over said charge accumulation region, and a fixed charge layer over said oxide layer, said fixed charge layer comprising a material selected from the group consisting of hafnium oxide, zirconium oxide, and hafnium silicates and extending under a shallow trench isolation region.

14. A pixel cell comprising a photodiode, said photodiode comprising a charge accumulation region, an oxide material over the charge accumulation region, a virtual p-type region between the charge accumulation region and the oxide material, a fixed negative-charge material over said oxide material, wherein the fixed charge material comprises at least one of hafnium oxide, zirconium oxide, and hafnium silicate, and a shallow trench isolation region, wherein the oxide and fixed charge layers extend under the shallow trench isolation region.

15. A processor system, comprising:
a processor and an image sensor coupled to said processor, said image sensor comprising an array of pixels, each pixel comprising a photodiode, said photodiode having an n-type charge accumulation region, an oxide layer over said n-type charge accumulation region, a virtual p-type layer between the n-type charge accumulation region and the oxide layer, a fixed charge layer over said oxide layer, and a shallow trench isolation region, wherein at least one of the oxide layer or fixed charge layer extends under the shallow trench isolation region.

16. The processor system of claim 15, wherein said fixed charge layer comprises an high K dielectric material.

17. The processor system of claim 15, wherein no p-type implant region is present between said n-type charge accumulation region and said oxide layer.

18. The processor system of claim 15, wherein said fixed charge layer comprises a material selected from the group consisting of hafnium oxide, zirconium oxide, and hafnium silicates.

19. The processor system of claim 15, wherein said oxide layer is a gate oxide.

20. The processor system of claim 15, wherein said n-type charge accumulation region, said oxide layer, and said fixed charge layer are provided over a substrate.

21. The processor system of claim 15, wherein said fixed charge layer comprises aluminum oxide.

22. The processor system of claim 21, wherein said aluminum oxide has a stoichiometry of $Al_xO_y$, where x is about 2 and y is about 3.

23. The processor system of claim 15, wherein said n-type charge accumulation region is provided within a substrate.

24. The processor system of claim 23, wherein said oxide layer is provided at least partially over said substrate.

* * * * *